US008322766B1

(12) United States Patent
Hsiung et al.

(10) Patent No.: US 8,322,766 B1
(45) Date of Patent: Dec. 4, 2012

(54) WAFER GRIPPER

(75) Inventors: William Hsiung, Jhunan Township, Miaoli County (TW); Shih-Chun Lo, Jhunan Township, Miaoli County (TW); Tony Lin, Jhunan Township, Miaoli County (TW)

(73) Assignee: Gintech Energy Corporation (TW)

( * ) Notice: Subject to any disclaimer, the term of this patent is extended or adjusted under 35 U.S.C. 154(b) by 0 days.

(21) Appl. No.: 13/287,736

(22) Filed: Nov. 2, 2011

(51) Int. Cl.
*B25J 15/08* (2006.01)

(52) U.S. Cl. ........................................ 294/213; 294/902

(58) Field of Classification Search .................. 294/213, 294/119.1, 197, 203, 103.1, 902; 414/222.01, 414/618, 744.2, 941; 901/37, 39
See application file for complete search history.

(56) References Cited

U.S. PATENT DOCUMENTS 4,453,757 A 6/1984 Soraoka ...................... 294/86 R
4,707,013 A * 11/1987 Vranish et al. ............. 294/119.1
4,831,721 A * 5/1989 Hirai et al. ...................... 901/40
5,188,501 A * 2/1993 Tomita et al. ............ 414/416.08
5,205,599 A * 4/1993 Wassmer et al. .............. 294/902
5,733,426 A 3/1998 Cox et al. ................. 204/298.01
5,762,391 A * 6/1998 Sumnitsch ................. 294/119.1
6,050,739 A 4/2000 Dunn ............................ 403/260
6,779,253 B2 * 8/2004 Kim .......................... 294/103.1

FOREIGN PATENT DOCUMENTS

GB 2279639 * 11/1995
JP 3211749 9/1991
JP 2003145466 5/2003
WO WO0205331 1/2002
WO WO0218107 3/2002

* cited by examiner

*Primary Examiner* — Paul T Chin
(74) *Attorney, Agent, or Firm* — Hayes Soloway P.C.

(57) ABSTRACT

A gripper applied in a transport mechanism for transporting a wafer is provided. The transport mechanism includes a bar. The gripper includes a fixing member fixed to the bar, and a carrying member. The fixing member includes two grooves adjacent to the bottom of the fixing member. Each groove includes an entrance and a retaining portion. The carrying member includes a notch and a first claw. The notch is located at the top of the carrying member and communicates two opposite sides of the carrying member. The notch includes two inner walls, each having a protrusion. The carrying member is assembled to the fixing member by sliding each protrusion along one of the grooves from the corresponding entrance and until abutting against the corresponding retaining portion. The first claw is located at a first sidewall of the carrying member. The edge of the wafer is supportable by the first claw.

10 Claims, 5 Drawing Sheets

12
122 120
10
100 102
20
2
22
3

WAFER GRIPPER

BACKGROUND

1. Field of Invention

The present invention relates to a gripper, and more particularly, to a gripper for gripping a wafer.

2. Description of Related Art

Solar energy has the features of being inexhaustible, environmentally friendly, and highly practical. Solar wafers are the focus of much attention. Methods of improving efficiency, such as those related to mass production and rapid classification and placing, are sought after by the whole industry. Reducing the number of defects occurring in the processes is also very important.

Presently, the transporting of solar screen-printing equipment typically involves using a gripper that is fastened to a transport mechanism to hold and transport the solar screen-printing equipment. Transporting at this time entails the use of a transport mechanism which drives a set of grippers to grip wafers on a walking beam and then place the wafers on a rear shelf. Another transport mechanism drives another set of grippers to grip wafers on a front shelf and then place the wafers on the walking beam. When a gripper needs to be replaced, a screw for fastening the gripper to the transport mechanism must be removed to allow for disassembly of the gripper.

However, there are up to twenty grippers used in the foregoing transport mechanism. Although the grippers at the outer side of the transport mechanism (i.e., the side that faces maintenance staff) can be easily disassembled, the grippers at the inner side of the transport mechanism (i.e., the side that faces away from the maintenance staffs) are not easily disassembled and therefore often require about one hour to remove. Moreover, when a conventional gripper needs to be disassembled, a tool such as a hex wrench or screwdriver must be used. In other words, much time and effort are required to replace or install the grippers. Furthermore, various problems are encountered when installing grippers, including screw or bolt stripping, left, right, front, or rear tilting of the grippers, non-uniform height of the grippers, etc.

SUMMARY

In order to solve the problems of the prior art, the invention provides an improved gripper. The gripper of the invention is divided into a fixing member that is fastened to a bar of a transport mechanism and a carrying member that can be rapidly assembled to and disassembled from the fixing member. With the two-piece gripper of the invention, maintenance staff can easily replace the carrying member should it become worn using bare hands, and it is unnecessary to disassemble the fixing member that is fastened to the transport mechanism. Therefore, the design of the two-piece gripper of the invention can help maintenance staff to replace grippers without the use of tools to thereby save time. Moreover, the gripper of the invention additionally has a positioning member. The positioning member can ensure that the carrying member can be precisely and stably assembled to the fixing member.

According to an embodiment of the invention, a gripper applied in a transport mechanism is provided. The transport mechanism is used for transporting a wafer. The transport mechanism includes a bar. The gripper includes a fixing member and a carrying member. The fixing member is fixed to the bar. The fixing member includes two grooves that are adjacent to the bottom of the fixing member and are respectively disposed at two sides of the fixing member in parallel. Each of the grooves includes an entrance and a retaining portion respectively disposed at two ends of the corresponding groove. The carrying member includes a notch and a first claw. The notch is located at the top of the carrying member and communicates two opposite sides of the carrying member. The notch has two inner walls that are parallel to each other. Each of the inner walls has a protrusion. The carrying member is assembled to the fixing member by sliding each of the protrusions along one of the grooves from the corresponding entrance and until abutting against the corresponding retaining portion. The first claw is located at a first sidewall of the carrying member. The edge of the wafer is supportable by the first claw.

In an embodiment of the invention, the fixing member further includes a positioning member disposed at the bottom of the fixing member. The carrying member has a recess located at the bottom of the notch. The positioning member and the bottom of the notch form an interference fit during the operation of assembling the carrying member to the fixing member. The positioning member is accommodated in the recess when each of the protrusions abuts against the corresponding retaining portion.

In an embodiment of the invention, the positioning member includes a main body, a resilient member, and a positioning ball. The main body is disposed in the fixing member and has an accommodating slot. The accommodating slot has an opening located at the bottom of the fixing member and an inner end opposite the opening. The resilient member is accommodated in the accommodating slot and is connected to or abutted against the inner end of the accommodating slot. The positioning ball is connected to or abutted against the resilient member and partially protrudes out of the opening. The positioning ball compresses the resilient member toward the inner end of the accommodating slot when pressed.

In an embodiment of the invention, the positioning member is a ball-ended thrust screw.

In an embodiment of the invention, the fixing member has a channel passing from the top of the fixing member to the bottom of the fixing member. The positioning member is assembled to the bottom of the fixing member by being inserted from the top of the fixing member through the channel.

In an embodiment of the invention, the fixing member includes a fastening hole. The fixing member is fastened to the bar by a fastening member via the fastening hole.

In an embodiment of the invention, the grooves are substantially parallel to the bar.

In an embodiment of the invention, the carrying member further includes a second claw located at a second sidewall of the carrying member. The second sidewall and the first sidewall are parallel to each other. The edge of the wafer is supportable by the second claw.

In an embodiment of the invention, the first sidewall and the second sidewall of the carrying member are parallel to the inner walls of the carrying member. The carrying member can be selectively assembled to the fixing member with the first sidewall facing the transport mechanism or with the second sidewall facing the transport mechanism.

In an embodiment of the invention, the material of the fixing member includes metal, and the material of the carrying member includes polymers.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
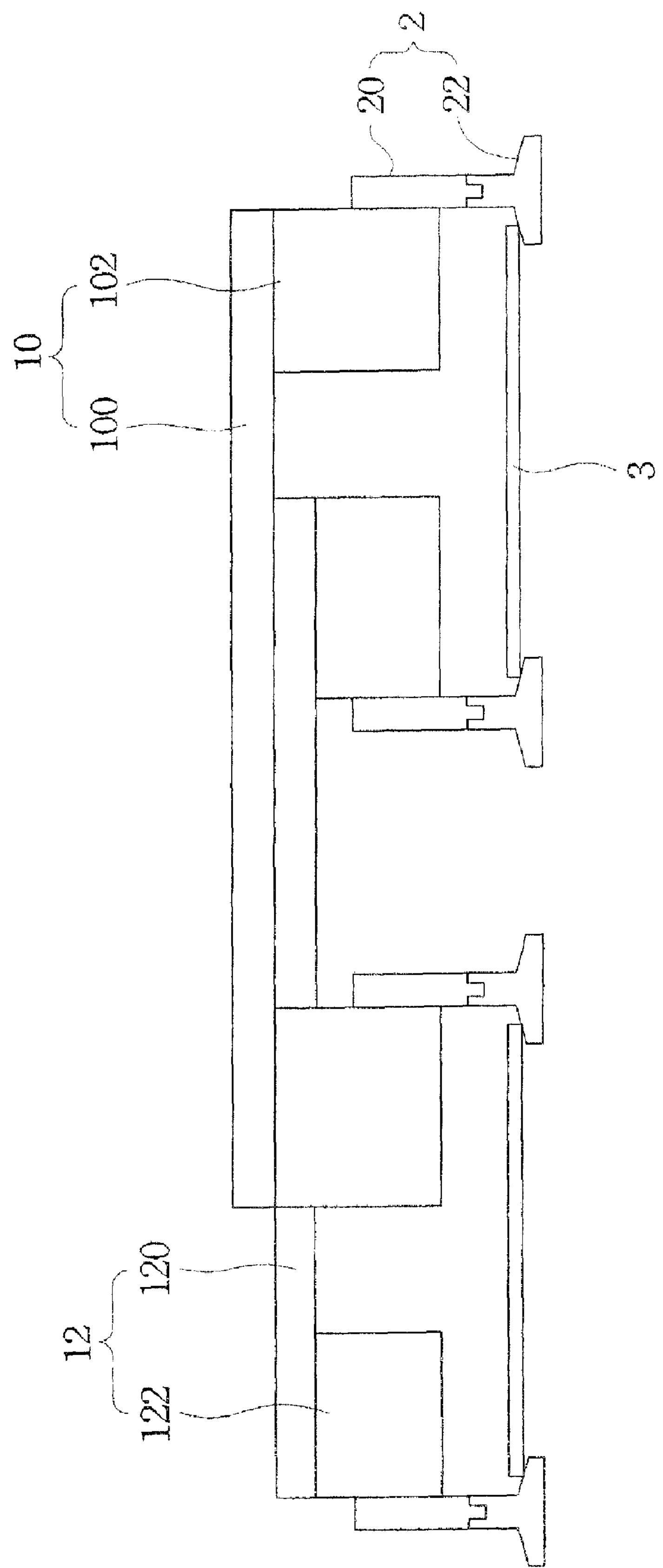
FIG. 1 is a side view of grippers according to an embodiment of the invention, in which the grippers are shown in a state applied in transport mechanisms.

Reference will now be made in detail to the present embodiments of the invention, examples of which are illustrated in the accompanying drawings. Wherever possible, the same reference numbers are used in the drawings and the description to refer to the same or like parts.

An improved gripper is provided. Specifically, the gripper of the invention is divided into a fixing member that is fastened to a bar of a transport mechanism and a carrying member that can be rapidly assembled to and disassembled from the fixing member. With the two-piece gripper of the invention, maintenance staff can easily replace the carrying member should it become worn using bare hands, and it is unnecessary to disassemble the fixing member that is fastened to the transport mechanism. Therefore, the design of the two-piece gripper of the invention can help maintenance staff to quickly replace grippers without the use of tools. Moreover, the gripper of the invention additionally has a positioning member. The positioning member can ensure that the carrying member can be precisely assembled to the fixing member and provide higher assembly stability.

FIG. 1 is a side view of grippers 2 according to an embodiment of the invention, in which the grippers 2 are shown in a state applied in transport mechanisms 10, 12.

As shown in FIG. 1, the grippers 2 can be applied in the transport mechanism 10 and the transport mechanism 12. The transport mechanism 10 includes a connection board 100 and two bars 102. The bars 102 of the transport mechanism 10 are respectively disposed at two ends of the connection board 100 in parallel. Similarly, the transport mechanism 12 includes a connection board 120 and two bars 122. The bars 122 of the transport mechanism 12 are respectively disposed at two ends of the connection board 120 in parallel.

The transport mechanism 10 is disposed more to the outer side (i.e., the right side in FIG. 1), and the transport mechanism 12 is disposed more to the inner side (i.e., the left side in FIG. 1). The bar 102 of the transport mechanism 10 that is adjacent to the inner side is located between the bars 122 of the transport mechanism 12. Moreover, the bar 122 of the transport mechanism 12 that is adjacent to the outer side is located between the bars 102 of the transport mechanism 10. The grippers 2 disposed on the bars 102 of the transport mechanism 10 all face the outer side, and the grippers 2 disposed on the bars 122 of the transport mechanism 12 all face the inner side.

When the transport mechanism 10 moves toward the inner side or the transport mechanism 12 moves toward the outer side, the grippers 2 on the bars 102 that face the outer side and the grippers 2 on the bars 122 that face the inner side will close to grip the edges of wafers 3. In other words, the transport mechanism 10 and the transport mechanism 12 can cooperate to transport the wafers 3. However, the manner in which the grippers 2 of the invention are used is not limited to the foregoing description. When maintenance staff stands at the outer side, no difficulties are encountered in assembling or disassembling the grippers 2 on the transport mechanism 10 that face the outer side, but the grippers 2 on the transport mechanism 12 that face the inner side may not be as easily assembled or disassembled. The configuration of each of the grippers 2 will be described in detail below.

Figure 2A:
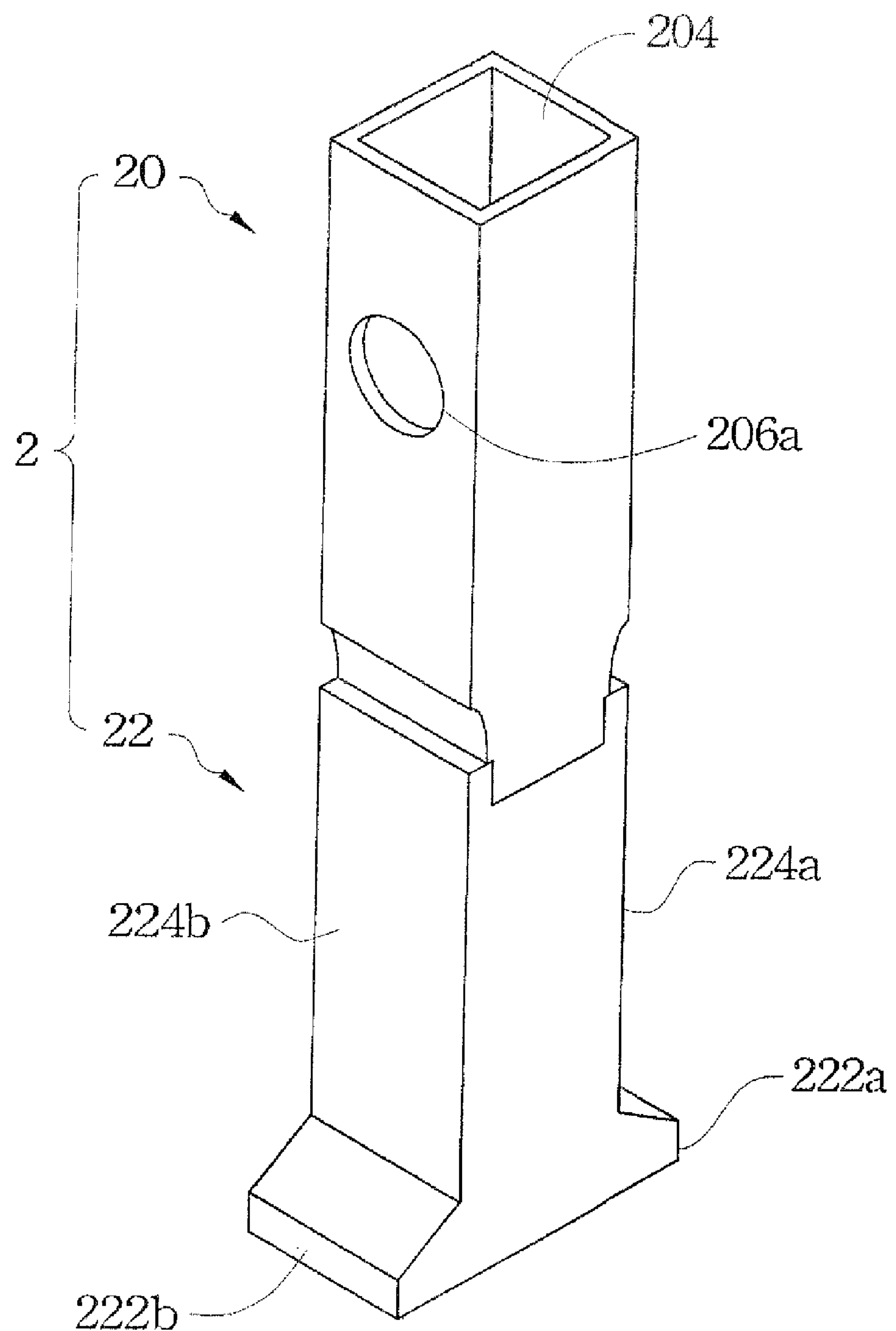
FIG. 2A is a perspective view of one of the grippers in FIG. 1.
Figure 2B:
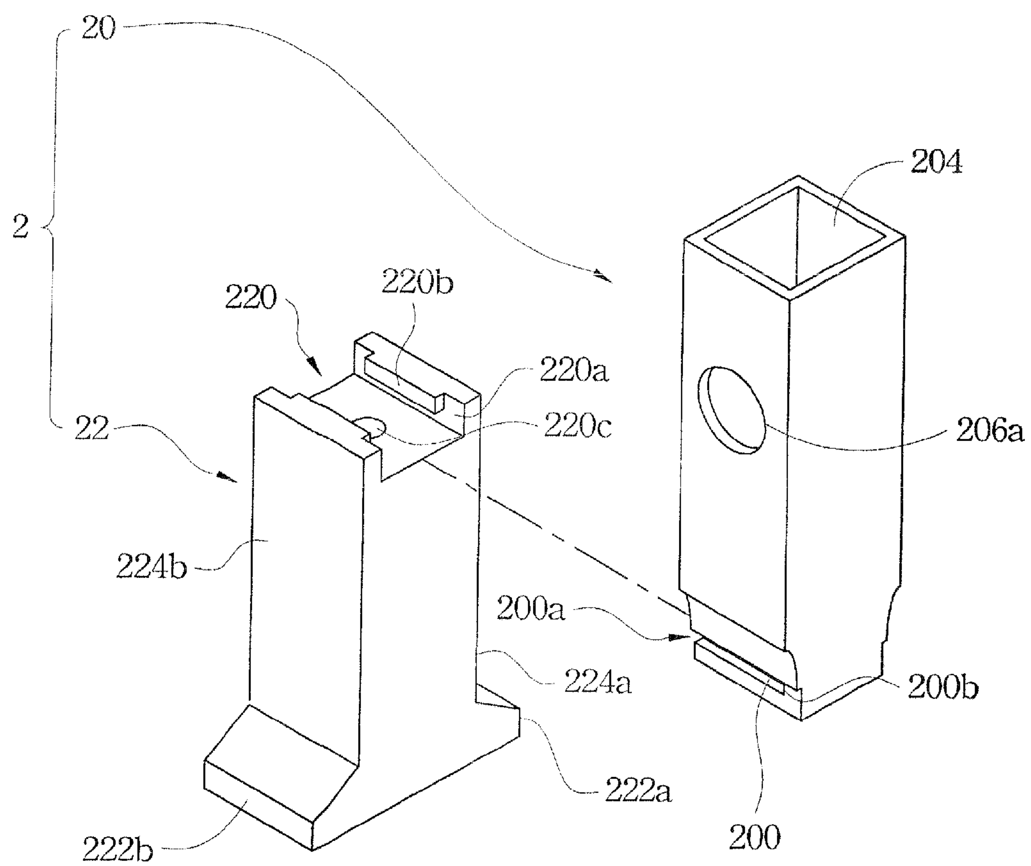
FIG. 2B is an exploded view showing the gripper in FIG. 2A.

FIG. 2A is a perspective view of one of the grippers 2 in FIG. 1. FIG. 2B is an exploded view showing the gripper 2 in FIG. 2A.

As shown in FIG. 2A and FIG. 2B, the gripper 2 includes a fixing member 20 and a carrying member 22. The fixing member 20 of the gripper 2 can be fixed to the sidewall of any bar 102 of the transport mechanism 10 or that of any bar 122 of the transport mechanism 12. The fixing member 20 of the gripper 2 includes two grooves 200. The grooves 200 of the fixing member 20 are adjacent to the bottom of the fixing member 20 and are respectively disposed at two sides of the fixing member 20 in parallel. Each of the grooves 200 of the fixing member 20 includes an entrance 200*a* and a retaining portion 200*b* respectively disposed at two ends of the corresponding groove 200.

As shown in FIG. 2A and FIG. 2B, the carrying member 22 of the gripper 2 includes a notch 220 and a first claw 222*a*. The notch 220 of the carrying member 22 is located at the top of the carrying member 22 and communicates two opposite sides of the carrying member 22. The notch 220 of the carrying member 22 has two inner walls 220*a* that are parallel to each other, and each of the inner walls 220*a* has a protrusion 220*b*. Each of the protrusions 220*b* of the carrying member 22 of the gripper 2 is configured such that the protrusion 220*b* is able to enter one of the grooves 200 from the corresponding entrance 200*a* and slide along the groove 200. After each of the protrusions 220*b* is slid fully into the corresponding groove 200, the protrusion 220*b* abuts against the corresponding retaining portion 200*b*, such that the assembly process of the carrying member 22 to the fixing member 20 is completed. In other words, when the carrying member 22 of the gripper 2 is assembled to the fixing member 20, each of the protrusions 220*b* will be accommodated in the corresponding groove 200 and abut against the corresponding retaining portion 200*b*. The shape of the protrusions 220*b* on the inner walls 220*a* is not limited by the shape shown in FIG. 2B and can be varied depending on design requirements. Moreover, the first claw 222*a* of the carrying member 22 is located at a first sidewall 224*a* of the carrying member 22. The edge of each wafer 3 may be supported by the first claw 222*a* of the carrying member 22.

Figure 3:
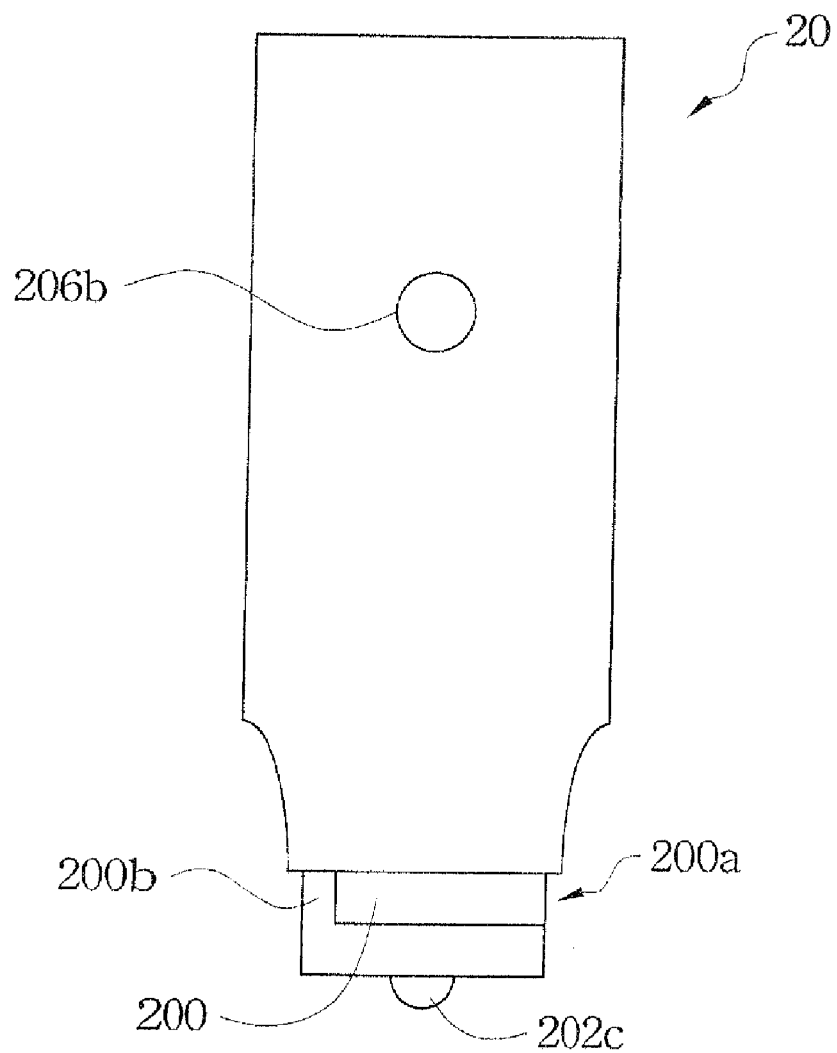
FIG. 3 is a side view showing a fixing member of the gripper in FIG. 2A.

FIG. 3 is a side view showing the fixing member of the gripper in FIG. 2A.

As shown in FIG. 2A, 2B and FIG. 3, the fixing member 20 of the gripper 2 includes a through hole 206*a* and a fastening hole 206*b*. The fastening hole 206*b* of the fixing member 20 is horizontally aligned with the through hole 206*a*. Maintenance staff can fasten the fixing member 20 to one of the bars 102 of the transport mechanism 10 or to one of the bars 122 of the transport mechanism 12 by extending a fastening member (e.g., a screw) through the through hole 206*a* and the fastening hole 206*b*, and securing the fastening member to the bar 102 or 122. In some embodiments, the size of the foregoing fastening member is smaller than that of the through hole

206*a*, so the fastening member can pass through the through hole 206*a* of the fixing member 20, and the size of the foregoing fastening member is larger than that of the fastening hole 206*b*, so the fastening member can engage the fastening hole 206*b* of the fixing member 20. In this case, screw threads (not shown) may be formed in the fastening hole 206*b*.

As shown in FIG. 2B, after being fastened to one of the bars 102 of the transport mechanism 10 or one of the bars 122 of the transport mechanism 12, the grooves 200 of the fixing member 20 are substantially parallel to the bar 102 or the bar 122. With this configuration, the direction along which the carrying member 22 of the gripper 2 is assembled to the fixing member 20 is substantially parallel to the bar 102 or the bar 122 and perpendicular to the moving direction of the transport mechanism 10 and the transport mechanism 12. Accordingly, when the transport mechanism 10 and the transport mechanism 12 grip the wafers 3 with the grippers 2, no component force will be generated to separate the carrying member 22 from the fixing member 20.

As shown in FIG. 2A and FIG. 2B, the carrying member 22 of the gripper 2 further includes a second claw 222*b*. The second claw 222*b* of the carrying member 22 is located at a second sidewall 224*b* of the carrying member 22. The second sidewall 224*b* and the first sidewall 224*a* of the carrying member 22 are parallel to each other. The edge of each wafer 3 may also be carried by the second claw 222*b*. Moreover, the first sidewall 224*a* and the second sidewall 224*b* of the carrying member 22 are parallel to the inner walls 220*a* of the notch 220 of the fixing member 2. The carrying member 22 of the gripper 2 can be selectively assembled to the fixing member 20 with the first sidewall 224*a* facing the transport mechanism 10 or the transport mechanism 12 or with the second sidewall 224*b* facing the transport mechanism 10 or the transport mechanism 12. In other words, when the fixing member 20 of the gripper 2 is fastened to the sidewall of one of the bars 102 of the transport mechanism 10 or that of one of the bars 122 of the transport mechanism 12 and the carrying member 22 is assembled to the fixing member 20, either the first claw 222*a* faces the inner side and the second claw 222*b* faces the outer side, or first claw 222*a* faces the outer side and the second claw 222*b* faces the inner side. Accordingly, when the first claw 222*a* of the carrying member 22 becomes worn after being used for a long time and needs to be replaced, the carrying member 22 can be re-assembled to the fixing member 20 with the second sidewall 224*b* facing the transport mechanism 10 or the transport mechanism 12, so that the second claw 222*b* can be used to carry the wafer 3. Therefore, the lifetime of the gripper 2 of the invention can be lengthened, that is, the gripper 2 of the invention has double the service life as a result of such a configuration.

Figure 4A:
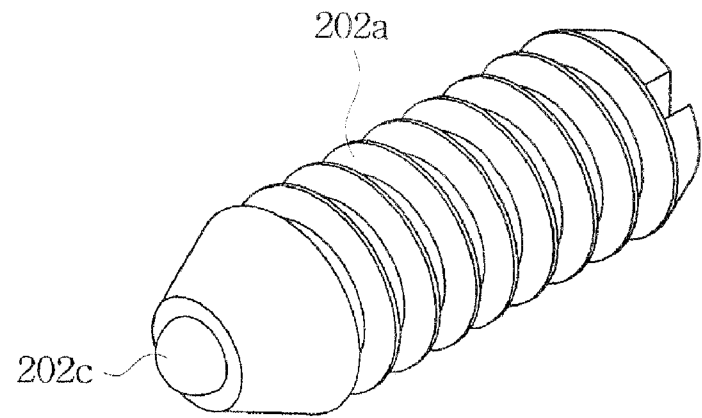
FIG. 4A is a perspective view showing a positioning member that is disposed in the fixing member in FIG. 3.

FIG. 4A is a perspective view showing a positioning member that is disposed in the fixing member in FIG. 3.

As shown in FIG. 2B and FIG. 4A, the fixing member 20 of the gripper 2 further includes a positioning member 202. The positioning member 202 is disposed at the bottom of the fixing member 20. The carrying member 22 of the gripper 2 has a recess 220*c* located at the bottom of the notch 220. The positioning member 202 and the bottom of the notch 220 form an interference fit during assembly of the carrying member 22 to the fixing member 20 of the gripper 2. Moreover, the positioning member 202 will be accommodated in the recess 220*c* when each of the protrusions 220*b* abuts against the corresponding retaining portion 200*b*. Thus, the carrying member 22 of the gripper 2 can be securely assembled to the fixing member 20 with a high degree of stability.

Figure 4B:
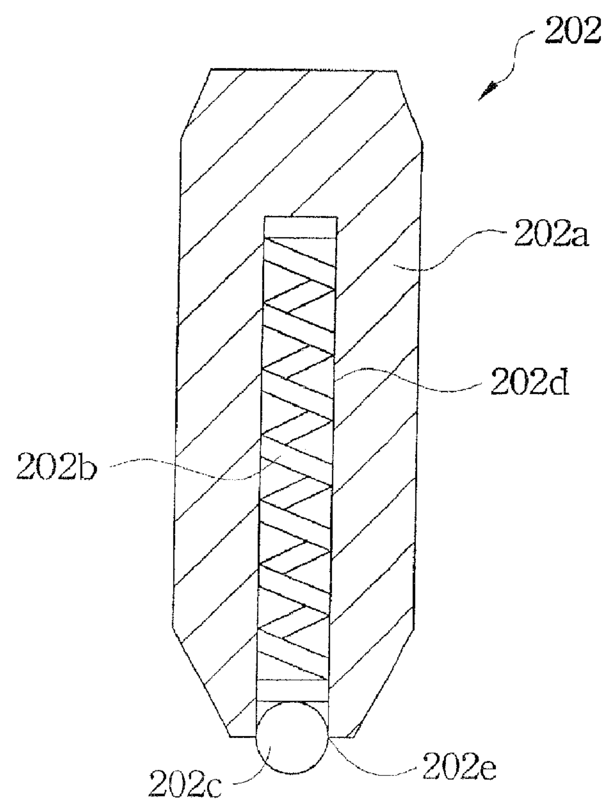
FIG. 4B is a sectional view showing the positioning member in FIG. 4A.

FIG. 4B is a sectional view showing the positioning member in FIG. 4A.

As shown in FIG. 4B, the positioning member 202 of the fixing member 20 includes a main body 202*a*, a resilient member 202*b*, and a positioning ball 202*c*. The main body 202*a* of the positioning member 202 is disposed in the fixing member 20 and has an accommodating slot 202*d*. The accommodating slot 202*d* of the main body 202*a* has an opening 202*e* located at the bottom of the fixing member 20, and an inner end opposite to the opening 202*e*. The resilient member 202*b* of the positioning member 202 is accommodated in the accommodating slot 202*d* of the main body 202*a* and connected to or abutted against the inner end of the accommodating slot 202*d*. The positioning ball 202*c* of the positioning member 202 is connected to or abutted against the resilient member 202*b* and partially extends out of the opening 202*e* of the accommodating slot 202*d*.

The positioning ball 202*c* of the positioning member 202 can be pressed to compress the resilient member 202*b* toward the inner end of the accommodating slot 202*d*. The positioning ball 202*c* of the positioning member 202 and the bottom of the notch 220 will form an interference fit during assembly of the carrying member 22 to the fixing member 20 of the gripper 2. That is, the positioning ball 202*c* of the positioning member 202 will be accommodated in the recess 220*c* when each of the protrusions 220*b* abuts against the corresponding retaining portion 200*b*. It can be seen that the resilient member 202*b* can cushion the positioning member 202 during assembly of the carrying member 22 to the fixing member, so that abrasion between the positioning ball 202*c* of the positioning member 202 and the bottom of the notch 220 can be reduced.

As shown in FIG. 2B and FIG. 4A, the fixing member 20 of the gripper 2 has a channel 204. The channel 204 of the fixing member 20 passes from the top of the fixing member 20 to the bottom of the fixing member 20. Screw threads that are meshed to each other can be formed on the exterior of the main body 202*a* of the positioning member 202 and on the interior of the channel 204 of the fixing member 20 at a portion of the channel 204 that is adjacent to the bottom of the fixing member 20. The positioning member 202 of the fixing member 20 can be assembled to the bottom of the fixing member 20 by inserting the positioning member 202 into the fixing member 20 from the top of the fixing member 20 through the channel 204. After the positioning member 202 is secured to the fixing member 20, the positioning ball 202*c* of the positioning member 202 protrudes out of the bottom of the fixing member 20. By the formation of the channel 204 in the fixing member 20 of the gripper 2, not only can the positioning member 202 be easily assembled, but also the material and the cost of the fixing member 20 can be reduced. In the embodiment of the invention, the positioning member 202 can be, but is not limited to being, a ball-ended thrust screw.

In another embodiment of the invention, the channel 204 can also be omitted from the configuration of the fixing member 20 of the gripper 2. In this case, for example, the screw threads that are meshed to each other can be formed on the exterior of the main body 202*a* of the positioning member 202 and on the bottom of the fixing member 20, so that the positioning member 202 can be directly fastened to the bottom of the fixing member 20 by being threaded thereon in a bottom-to-top direction. Alternatively, the main body 202*a* of the positioning member 202 may be integrally formed with the fixing member 20, the accommodating slot 202*d*, which is disposed in the main body 202*a* of the positioning member 202 in the embodiment described with reference to FIG. 4B, may be formed in the bottom of the fixing member 20, and the resilient member 202*b* connected to or abutted against the positioning ball 202*c* may be received in the accommodating slot 202*d*.

In an embodiment of the invention, in order to maintain the structural strength of the gripper 2 fastened to the sidewall of one of the bars 102 of the transport mechanism 10 or to the sidewall of one of the bars 122 of the transport mechanism 12, the material of the fixing member 20 of the gripper 2 can include metal. Moreover, in order not to scratch the wafers while gripping or carrying the same, the material of the carrying member 20 can include elastic polymers.

According to the foregoing recitations of the embodiments of the invention, it can be seen that the gripper of the invention is divided into a fixing member that is fastened to one of the bars of the transport mechanism and a carrying member that can be rapidly assembled to and disassembled from the fixing member. With the two-piece gripper of the invention, maintenance staff can easily replace the carrying member should it become worn using bare hands, and it is unnecessary to disassemble the fixing member that is fastened to the transport mechanism. Therefore, the design of the two-piece gripper of the invention can help maintenance staff to quickly replace grippers without the use of tools. Moreover, the gripper of the invention additionally has a positioning member. The positioning member can ensure that the carrying member can be precisely assembled to the fixing member and provide higher assembly stability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A gripper applied in a transport mechanism, the transport mechanism being used for transporting a wafer, the transport mechanism comprising a bar, the gripper comprising:

- a fixing member fixed to the bar and comprising two grooves adjacent to the bottom of the fixing member and respectively disposed at two sides of the fixing member in parallel, wherein each of the grooves comprises an entrance and a retaining portion respectively disposed at two ends of the corresponding groove; and
- a carrying member comprising:
  - a notch located at the top of the carrying member and communicating two opposite sides of the carrying member, the notch having two inner walls that are parallel to each other, each of the inner walls having a protrusion, wherein the carrying member is assembled to the fixing member by sliding each of the protrusions along one of the grooves from the corresponding entrance and until abutting against the corresponding retaining portion; and
  - a first claw located at a first sidewall of the carrying member, wherein the edge of the wafer is supportable by the first claw.

2. The gripper of claim 1, wherein the fixing member further comprises a positioning member disposed at the bottom of the fixing member, the carrying member has a recess located at the bottom of the notch, the positioning member and the bottom of the notch form an interference fit during the operation of assembling the carrying member to the fixing member, and the positioning member is accommodated in the recess when each of the protrusions abuts against the corresponding retaining portion.

3. The gripper of claim 2, wherein the positioning member comprises:

- a main body disposed in the fixing member and having an accommodating slot, the accommodating slot having an opening located at the bottom of the fixing member and an inner end opposite the opening;
- a resilient member accommodated in the accommodating slot and connected to or abutted against the inner end of the accommodating slot; and
- a positioning ball connected to or abutted against the resilient member and partially protruding out of the opening, the positioning ball compressing the resilient member toward the inner end of the accommodating slot when pressed.

4. The gripper of claim 3, wherein the positioning member is a ball-ended thrust screw.

5. The gripper of claim 2, wherein the fixing member has a channel passing from the top of the fixing member to the bottom of the fixing member, and the positioning member is assembled to the bottom of the fixing member by being inserted from the top of the fixing member through the channel.

6. The gripper of claim 1, wherein the fixing member comprises a fastening hole, and the fixing member is fastened to the bar by a fastening member via the fastening hole.

7. The gripper of claim 1, wherein the grooves are substantially parallel to the bar.

8. The gripper of claim 1, wherein the carrying member further comprises a second claw located at a second sidewall of the carrying member, the second sidewall and the first sidewall are parallel to each other, and the edge of the wafer is supportable by the second claw.

9. The gripper of claim 8, wherein the first sidewall and the second sidewall of the carrying member are parallel to the inner walls of the carrying member, and the carrying member is able to be selectively assembled to the fixing member with the first sidewall facing the transport mechanism or with the second sidewall facing the transport mechanism.

10. The gripper of claim 1, wherein the material of the fixing member comprises metal, and the material of the carrying member comprises polymers.

* * * * *